SELF-BIASED FIELD EFFECT TRANSISTOR AMPLIFIER

Filed June 27, 1966 4 Sheets-Sheet 1

INVENTOR.
JOSEPH R. BURNS
BY John V. Regan
Attorney

SELF-BIASED FIELD EFFECT TRANSISTOR AMPLIFIER

Filed June 27, 1966 4 Sheets-Sheet 2

INVENTOR.
JOSEPH R. BURNS
BY John V. Regan
Attorney

July 9, 1968 J. R. BURNS 3,392,341

SELF-BIASED FIELD EFFECT TRANSISTOR AMPLIFIER

Filed June 27, 1966 4 Sheets-Sheet 3

INVENTOR.
JOSEPH R. BURNS
BY John V. Regan
Attorney

SELF-BIASED FIELD EFFECT TRANSISTOR AMPLIFIER

Filed June 27, 1966

INVENTOR.
JOSEPH R. BURNS
BY John V. Regan
Attorney

United States Patent Office 3,392,341

Patented July 9, 1968

3,392,341
SELF-BIASED FIELD EFFECT TRANSISTOR AMPLIFIER

Joseph R. Burns, Trenton, N.J., assignor to Radio Corporation of America, a corporation of Delaware Continuation-in-part of application Ser. No. 486,319, Sept. 10, 1965. This application June 27, 1966, Ser. No. 563,018
7 Claims. (Cl. 330—13)

ABSTRACT OF THE DISCLOSURE

A direct current (D.C.) stabilized high gain amplifier consisting of at least three insulated gate field effect transistors is described. One of the transistors is connected in the common source mode to provide signal inversion. Another of the transistors is used as a load for the common source transistor. The third transistor is used to provide a D.C. feedback from the output to the input of the amplifier. In one example, all of the transistors are of like conductivity and in another example the common source and load transistors are of opposite conductivity. In a further example, a fourth insulated gate field effect transistor is connected across the feedback transistor in order to compensate for noise feed-through.

This application is a continuation-in-part of my copending application for Amplifier, Ser. No. 486,319, filed Sept. 10, 1965, now abandoned.

This invention relates to electrical apparatus and in particular to electronic amplifier arrangements.

Electronic amplifiers are of fundamental importance in electronic systems. Sometimes this is apparent, as in a radio receiver, where the objective is to amplify a weak signal. Sometimes, the need for amplification is more subtle, as in an electronic computer where very few of the circuits are labeled "amplifier." However, amplification is present and important to insure against loss of signal information.

In the interest of reduced size, weight, power dissipation and cost, it is desirable to fabricate electrical amplifier circuits as integrated circuit structures. Insulated-gate field-effect transistors are particularly suitable for fabrication in integrated circuit arrangements.

An object of this invetnion is to provide a novel amplifying arrangement which includes field-effect transistors, Another object of this invention is to provide a novel variable gain amplifier which includes three insulated-gate field-effect transistors.

Briefly stated, the present invention is embodied as an amplifier having a transfer characteristic with a pair of separate low gain regions and a high gain region disposed therebetween. The amplifier circuit includes an enhancement type field-effect means having a terminal coupled to the amplifier input and a conduction path connected to the amplifier output. A bias means is coupled to the field-effect conduction path by way of a load impedance, for example the conduction path of another enhancement type field-effect means. A feedback path including a feedback impedance is provided between the amplifier output and input terminals and has a D.C. feedback characteristic intersecting the amplifier transfer characteristic in the high gain region.

According to one embodiment of the invention, the feedback impedance is the conduction path of a further field-effect means which also has a control or gate electrode. With only a static D.C. signal applied to the gate electrode of the feedback field-effect means, the amplifier operates with a constant (including zero) gain. On the other hand, if a dynamic signal is also applied to the gate electrode of the feedback field-effect means, the amplifier operates with a variable gain. In either case, the feedback field-effect means is operative to stabilize the amplifier in the high gain region of its D.C. transfer characteristic.

The invention itself, both as to its organization and method of operation, as well as additional objects, embodiments and advantages thereof, will become more readily apparent from a reading of the following description in connection with the accompanying drawings, in which.

Figure 1:
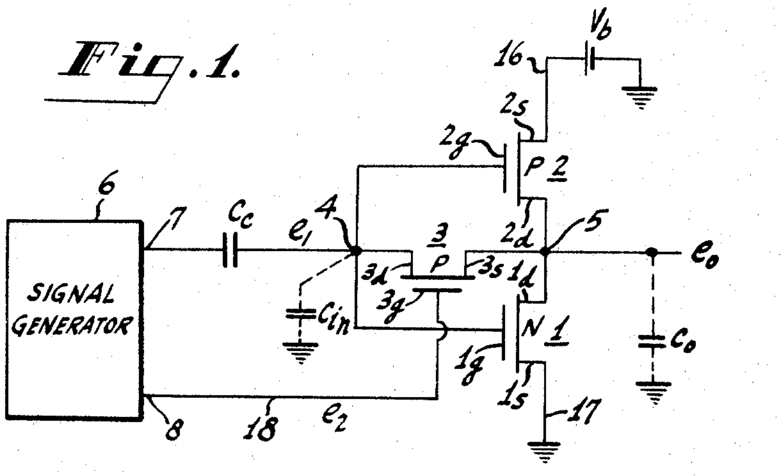
FIGS. 1 and 9 are circuit diagrams of stabilized amplifiers according to the present invention.

The active devices contemplated for use in practicing the invention are of a type known in the art as insulated-gate field-effect transistors. An insulated-gate field-effect transistor may generally be defined as a majority carrier field-effect device, which includes a body of semiconductive material. A carrier conduction channel within the semiconductive body is bounded at one end thereof by a source region and at the other end thereof by a drain region. A gate or control electrode means overlies at least a portion of the carrier conduction channel and is separated therefrom by a region of insulating material. Due to the insulation between the gate electrode and the channel, the input impedance of an insulated-gate field-effect transistor is very large, on the order of $10^{15}$ ohms or more, so that substantially no current flows in the gate electrode circuit. Thus, the insulated-gate field-effect transistor is a voltage controlled device. Signals or voltages applied to the gate electrode means control, by field-effect, the conductance of the channel.

Two known types of insulated-gate field-effect transistors are the thin-film transistor (TFT) and the metal-oxide semiconductor (MOS). Some of the physical and operating characteristics of a thin-film transistor are described in an article, by P. K. Weimer, entitled, "The TFT—A New Thin-Film Transistor," appearing at pages 1462–1469 of the June 1962 issue of the Proceedings of the IRE. The MOS transistor is described in an article entitled, "The Silicon Insulated-Gate Field-Effect Transistor," by S. R. Hofstein and F. P. Heiman, appearing at pages 1190–1202 of the September 1963 issue of the Proceedings of the IEEE.

Such transistors may be of either the enhancement type or the depletion type. The enhancement type unit is of particular interest in the present application. In an enhancement type unit, the impedance of the conduction channel is very high when the gate and source voltages have the same value. A signal of the proper polarity applied between the gate and source decreases the impedance of the conduction channel. In a depletion type unit, the impedance of the conduction path is relatively low when the source and gate have the same voltage. Input signals of the proper polarity applied between the source and drain increase the impedance of the conduction path.

It should be noted, however, that a depletion type transistor can be biased so that it operates as an enhancement type transistor. For example, a voltage source having an appropriate value and polarity connected in series with the gate electrode of a depletion type transistor can bias the transistor so that the impedance of its conductive channel is normally high. Input voltages of the proper polarity applied between the source electrode and the side of the voltage source remote from the gate electrode decrease the impedance of the conduction channel as in the enhancement type transistor. The terminology, enhancement type field-effect means or device, as used in the following description and appended claims, is intended to include not only an enhancement type transistor but also a depletion type transistor which is biased to operate like an enhancement type.

An insulated-gate field-effect transistor may be either a P-type or an N-type unit depending upon the majority carriers involved in drain current conduction. A P-type unit is one in which the majority carriers are holes; whereas, an N-type unit is one in which the majority carriers are electrons.

Figure 9:
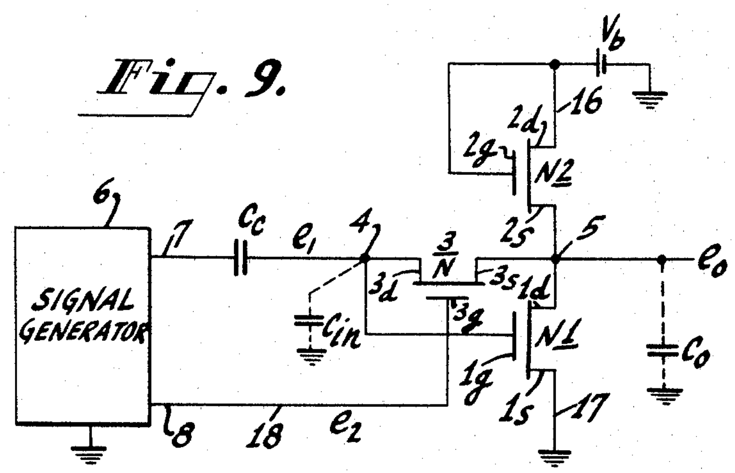

Referring now to FIGS. 1 and 9 in which like reference characters denote similar components, the amplifier of the present invention is illustrated in two embodiments of similar circuit construction. In each embodiment the amplifier has an input connection 4 which is connected to the gate electrode 1*g* of an N-type insulated-gate field-effect transistor 1. The drain electrode 1*d* of the transistor 1 is connected to the amplifier output connection 5.

A load impedance, illustrated as the conduction path of an insulated-gate field-effect transistor 2, is also connected to the output connection 5. In FIG. 1, the transistor 2 is a P-type having its drain electrode 2*d* connected to the output connection 5, its source electrode 2*s* connected to an electrical connection 16, and its gate electrode 2*g* connected to the input connection 4. In FIG. 9, the transistor 2 is an N-type having its source electrode 2*s* connected to the output connection 5 and both its gate electrode 2*g* and drain electrode 2*d* connected to the electrical connection 16.

A feedback path between the amplifier input and output connections 4 and 5 includes a feedback impedance illustrated as an insulated-gate field-effect transistor 3 of the P-type in FIG. 1 and of the N-type in FIG. 9. To this end, the source electrode 3*s* is connected to the output connection 5 and the drain electrode 3*d* is connected to the input connection 4. The gate electrode 3*g* is connected to the electrical connection 18. The amplifier circuits thus far described may be fabricated as articles in integrated circuit structures or modules.

For use in an electrical circuit, the input connection 4 in either FIG. 1 or 9 is coupled to a first terminal 7 of a signal source or generator 6. The gate electrode 3*g* of the feedback transistor is connected to a second terminal 8 of the signal generator 6 by way of a connection 18. The signal generator 6 represents the system with which the amplifier is associated. A suitable operating voltage, illustrated as a battery $V_b$ has its positive terminal connected to the source electrode 2*s* of transistor 2 and has its negative terminal connected to a point of reference potential indicated in the drawing by the conventional ground symbol. The source electrode 1*s* of the transistor 1 is also connected to circuit ground. In addition, the signal generator 6 is referenced to circuit ground, as shown by the conventional symbol in FIGS. 1 and 9.

D.C. OPERATING CONDITIONS

Figure 2:
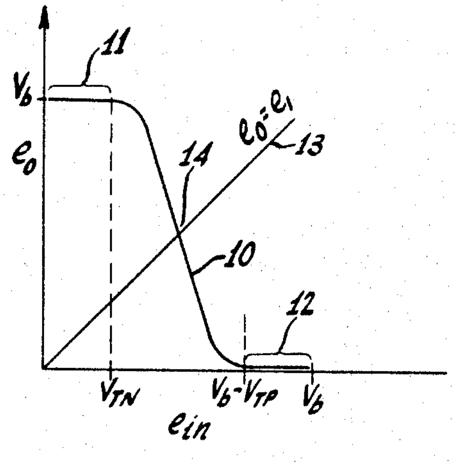
FIGS. 2 and 10 are plots of the input and output transfer characteristics of the amplifiers of FIGS. 1 and 9, respectively.
Figure 10:
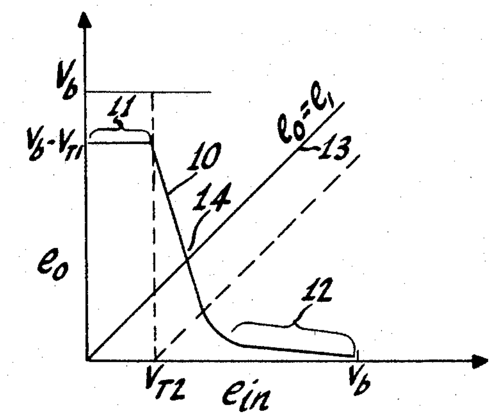

The D.C. transfer characteristics for the amplifiers of FIGS. 1 and 9 are illustrated in FIGS. 2 and 10, respectively, by plots of the electrical output signal $e_0$ versus the input signal $e_1$. The transfer characteristics in both FIGS. 2 and 10 have a high gain region 10 and boundary or low gain regions 11 and 12. Each of the signals $e_1$, $e_2$ and $e_0$ is considered to have a static D.C. component and a dynamic component. For the purpose of considering the D.C. operating characteristics of the amplifiers, the dynamic components are assumed equal to zero.

Referring first to the amplifier of FIG. 1 and the plot of FIG. 2, it is assumed at the outset that the feedback transistor 3 is not connected between the input and output connections 4 and 5. When the D.C. component of the input signal $e_1$ is at or near zero volt, the gate-to-source voltage of P-type transistor 2 is substantially $-V_b$ volt, and the gate-to-source voltage of the N-type transistor 1 is at substantially zero volt. Thus, the P-type transistor 2 is biased to a fully conductive condition and the transistor 1 is biased into cut-off. The D.C. component of the output signal $e_0$ has substantially the value of the operating voltage $V_b$, since the impedance of the channel of the P-type transistor 2 is nearly zero and the impedance of the channel of the N-type transistor is nearly infinite. For these conditions, the amplifier is operating in the low gain region 11 of its transfer characteristic.

As the input signal $e_1$ increases, the gate-to-source voltage of the P-type transistor increases in a positive direction, thereby tending to decrease the conductance of its channel. The gate-to-source voltage of the N-type transistor also increases positively as the input signal $e_1$ exceeds the threshold $V_{TN}$ of the N-type transistor 1. Thus, as the input signal $e_1$ increases, the N-type transistor 1 becomes conductive and both transistors 1 and 2 are conducting. For these conditions, the amplifier operates in the high gain region 10 of its transfer characteristic and the output signal $e_0$ has a D.C. value which is less than $V_b$.

As the input signal $e_1$ becomes more positive, the gate-to-source voltage of the P-type transistor approaches the threshold $V_{TP}$ of the P-type transistor 12, thereby tending to bias the P-type transistor into cut-off. The gate-to-source voltage of the N-type transistor increases in the positive direction, thereby tending to bias the N-type transistor into a fully conducting condition. The output signal $e_0$ decreases and approaches a value of substantially zero volt. For these conditions, the amplifier operates in the low gain region 12 of its transfer characteristic. To summarize, the amplifier operates in the high gain region 10 when both transistors 1 and 2 are conducting and operates in the low gain regions 11 and 12 when one only of the transistors 1 and 2 is conducting.

The feedback transistor 3 stabilizes the amplifier in the high gain region 10 of its transfer characteristic. Again consider that the dynamic components of the electrical signals $e_1$, $e_2$, and $e_3$ are zero. Assume also that the static D.C. component of the electrical signal $e_2$ is zero volts so that the P-type transistor 3 is conducting. For these conditions, the static D.C. components of the signal $e_0$ and $e_1$ become equal to one another. Both P-type transistors 2 and 3 and the N-type transistor 1 are biased into conductive regions of their operating characteristics. The 45° line 13 in FIG. 2 represents the $e_0=e_1$ characteristic. The intersection 14 of the line 13 with the high gain region 10 of the amplifier transfer characteristic represents the D.C. operating point of the amplifier.

It is convenient to describe this D.C. stabilization in terms of the input and output capacitances $C_{in}$ and $C_o$. The capacitance $C_{in}$ is the capacitance seen looking into the amplifier between the input connection 4 and ground; whereas the output capacitance $C_o$ is the capacitance seen looking back into the amplifier between the output connection 5 and ground. These capacitances include the interelectrode, substrate and other stray capacitance.

Assuming that the output impedance of the signal generator 6 is infinite, the input capacitance $C_{in}$ and the output capacitance $C_o$ become charged to the same D.C. voltage so that no current is conducted by the channel of the P-type transistor 3. For the case where the output impedance of the signal generator is finite, a coupling capacitor $C_c$ is necessary to maintain the charge of the input capacitance $C_{in}$.

The previous assumption that the static D.C. component of the electrical signal $e_2$ is zero is made for purposes of illustration. This static D.C. component could have any appropriate value relative to the operating voltage $V_b$ so long as all of the transistors 1, 2 and 3 are biased into conduction. It should be noted that the transistor 3 may be an N-type instead of a P-type in which case the D.C. component of $e_2$ must have an appropriate value to bias the transistor 2 into conduction.

The amplifier always stabilizes at $e_0=e_1$ in the high gain region 10 regardless of differences in the characteristic of the P and N-type transistors. That is to say, the 45° line 13 always intersects the D.C. transfer characteristic in the high gain region 10, whether or not the characteristics of the P and N-type transistors 1 and 2 are symmetrical.

Although the conduction path of transistor 2 has been previously described as a load impedance for transistor 1, it is apparent that the conduction path of transistor 1 is also a load impedance for transistor 2 in the amplifier of FIG. 1 due to the symmetry of the circuit. This is not true, however, for the amplifier of FIG. 9. In FIG. 9, the primary function of transistor 2 is to provide a load impedance for transistor 1. Due to the connection of the gate electrode 2$g$ to the drain electrode 2$d$, the N-type transistor 2 is continually biased into conduction. The level or amount of conduction, however, depends upon the D.C. conditions at the source electrode 2$s$ and, hence, the output connection 5.

The plot in FIG. 10 of the amplifier D.C. transfer characteristic illustrates these conditions both with and without the feedback transistor 3. First consider that feedback transistor 3 is not in the circuit. Also consider that transistors 1 and 2 have threshold voltages $V_{T1}$ and $V_{T2}$, respectively. When the D.C. component of the input signal $e_1$ is less than $V_{T1}$ volts, the transistor 1 is turned off so that the impedance of its channel is relatively high. The impedance of the channel of the conducting transistor 2 is much lower whereby the output capacitance $C_o$ is charged to a voltage of $V_b-V_{T2}$. Thus, the transistor 2 is just barely conducting to maintain the voltage across $C_o$. For these conditions, the amplifier is operating in the low gain region 11 of its transfer characteristic.

As the D.C. component of the input signal $e_1$ becomes more positive than $V_{T1}$, the N-type transistor 1 is conducting whereby the impedance of its conduction path becomes smaller. The output voltage $e_0$ or the voltage across the capacitance $C_o$ now has a value depedent upon the voltage divider action of the conduction path impedances of the transistors 1 and 2. For this condition, the amplifier is operating in the high gain region 10 of its transfer characteristic.

As the D.C. component of the input signal $e_1$ becomes more positive, the transistor 1 becomes more conductive whereby the impedance of its conduction path becomes smaller. As the conduction path impedance of transistor 1 decreases, the output signal $e_0$ decreases and approaches a value of substantially 0 volt. When the output signal $e_0$ has a value of 0 volt, both transistor 1 and transistor 2 are fully conductive and substantially all of the voltage $V_b$ is dropped across the conductive path of the transistor 2. For these conditions, the amplifier operates in the low gain region 12 of its transfer characteristic.

As in the embodiment of FIG. 1, the feedback transistor 3 also serves to stabilize the amplifier of FIG. 9 at the point 14 in the high gain region 10 of the transfer characteristic as shown in FIG. 10. The D.C. component of the signal $e_2$ is positive enough to bias N-type transistor 3 into conduction. The static D.C. components of the signals $e_1$ and $e_0$ become equal so that the amplifier is D.C. stabilized at the intersection 14 of the D.C. feedback characteristic curve 13 with the high gain region 10 of the amplifier D.C. transfer characteristic.

Although the amplifier embodiment of FIG. 9 has been illustrated with all N-type transistors it is apparent that all P-type transistors can be used so long as the appropriate voltage values are changed. Further it is apparent that the only requirement for the feedback transistor 3 is that it be D.C. biased into conduction so that its conductivity type has substantially no effect on the stabilization of the amplifier. Thus a P-type feedback transistor 3 can be used wth N-type transistors 1 and 2 and vice versa.

The amplifier embodiment of FIG. 9 is especially attractive for linear amplification because the absolute value of gain is dependent only on the ratio of the linear dimensions of the transistors 1 and 2. Both of the amplifier embodiments as illustrated are especially suited for integrated circuit structures since each is comprised only of active transistor devices However, it should be noted that the principles embodied in the illustrations of FIGS. 1 and 9 are fully applicable to the case where either or both of the load and feedback impedances are passive devices.

DYNAMIC OPERATION

For a given frequency of the dynamic component of the signal $e_1$, the amplifier embodiments of FIGS. 1 and 9 have either a constant or a variable gain depending upon the electrical signal $e_2$ applied at the gate electrode 3$g$ of the transistor 3. If the dynamic component of the signal $e_2$ is zero, its D.C. component maintains the impedance of the channel between the source 3$s$ and the drain 3$d$ constant. So long as this impedance remains constant, the gain of the amplifier remains constant.

On the other hand, if the dynamic component of the signal $e_2$ varies as a function of time, the impedance of the channel between the source 3$s$ and the drain 3$d$ also varies. In other words, the conduction channel of the feedback transistor 3 is an impedance; and the gate 3$g$ is a voltage control means which controls the value of the impedance.

The gain $G_f$ of any amplifier with feedback is given by $$G_f=\frac{G_o}{1+\beta G_o}$$

where $G_o$ is the gain without feedback and $\beta$ is the amount of output signal fed back to the input. Variations of the impedance of the channel of the feedback transistor 3 result in variations of the amount of output signal fed back to the input and, therefore, variations in $\beta$. Consequently, the amplifier embodiments of FIGS. 1 and 9 operate as constant gain amplifiers for the case where no dynamic signal is applied to the gate 3$g$ and as variable gain amplifiers for the case where a dynamic signal is applied to the gate 3$g$.

During a particular time period, the dynamic components of the electrical signals $e_1$ and $e_2$ may be analog or continuous in nature or they may be intermittent in nature occurring only during discrete intervals within the time period. In the following description, illustrations are given for the cases (1) where both signals $e_1$ and $e_2$ are continuous functions of time; (2) where $e_1$ is intermittent, and $e_2$ is continuous; (3) where $e_1$ is continuous, and $e_2$ is intermittent; and (4) where both $e_1$ and $e_2$ are intermittent.

*Case I*

Figure 3:
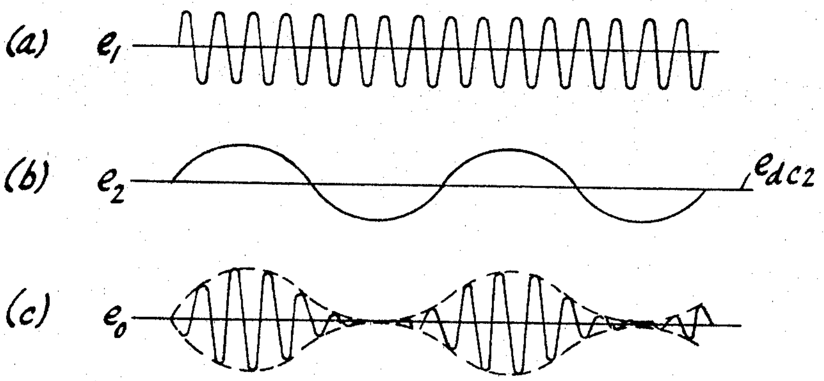
FIGS. 3 to 6 are waveform diagrams of the electrical signals occurring at various points in the amplifiers of FIGS. 1 and 9.

The case where both electrical signals $e_1$ and $e_2$ are analog or continuous in nature during the time period under consideration is shown in FIG. 3. For ease of illustration, both signals $e_1$ and $e_2$ are shown to be periodic signals each having a single frequency component. The electrical signal $e_2$ has a D.C. component $edc_2$ as illustrated by waveform ($b$) in FIG. 3. Where the frequency of the signal $e_1$ is higher than the frequency of the signal $e_2$, the amplifier operates as a modulator. Thus, the waveform ($a$) is the carrier signal $e_1$; the waveform ($b$) is the modulating signal $e_2$; and the waveform ($c$) is the modulated output signal $e_0$. A typical application for this modulator is in a radio transmitter type apparatus. For such an application the signal $e_2$ is an audio signal having a plurality of audio frequency components and the signal $e_1$ is the R.F. carrier.

According to the previous description of the static D.C. operation, the D.C. components of the carrier signal $e_1$ and the modulated output signal $e_0$ are identical. In addition, the single stage amplifier embodiments illustrated in FIGS. 1 and 9 are inverting type amplifiers, as can be seen by the inverted modulated carrier in FIGURE 3($c$).

*Case II*

Figure 4:
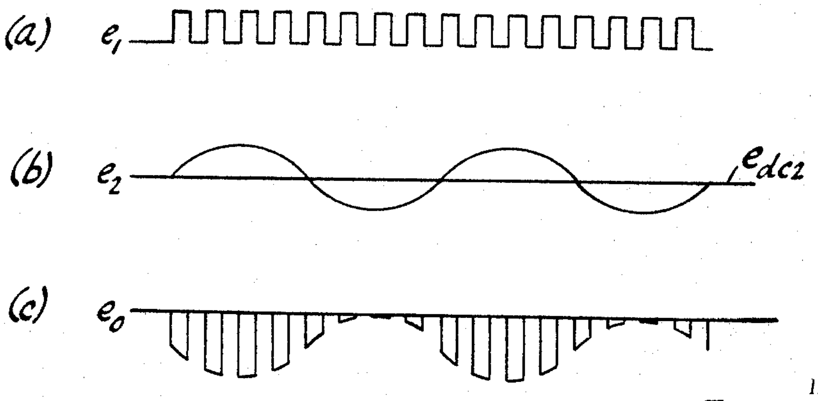

The case where the signal $e_1$ is intermittent and where the signal $e_2$ is continuous during the time period under consideration is illustrated in FIGURE 4. Again for ease of illustration, the signal $e_2$ is shown as a single frequency sinusoid in waveform (*b*) having a D.C. component $edc_2$. The signal $e_1$ is shown in waveform (*a*) as a pulse train having a rate of occurrence greater than the frequency of the signal $e_2$. Again, the amplifier is operative as a modulator and provides a pulse modulated output signal $e_0$, as shown in waveform (*c*). A typical application is in communications type apparatus wherein the signal $e_2$ is generally a multi-frequency information signal and the signal $e_1$ is the carrier signal.

*Case III*

Figures 5, 6:
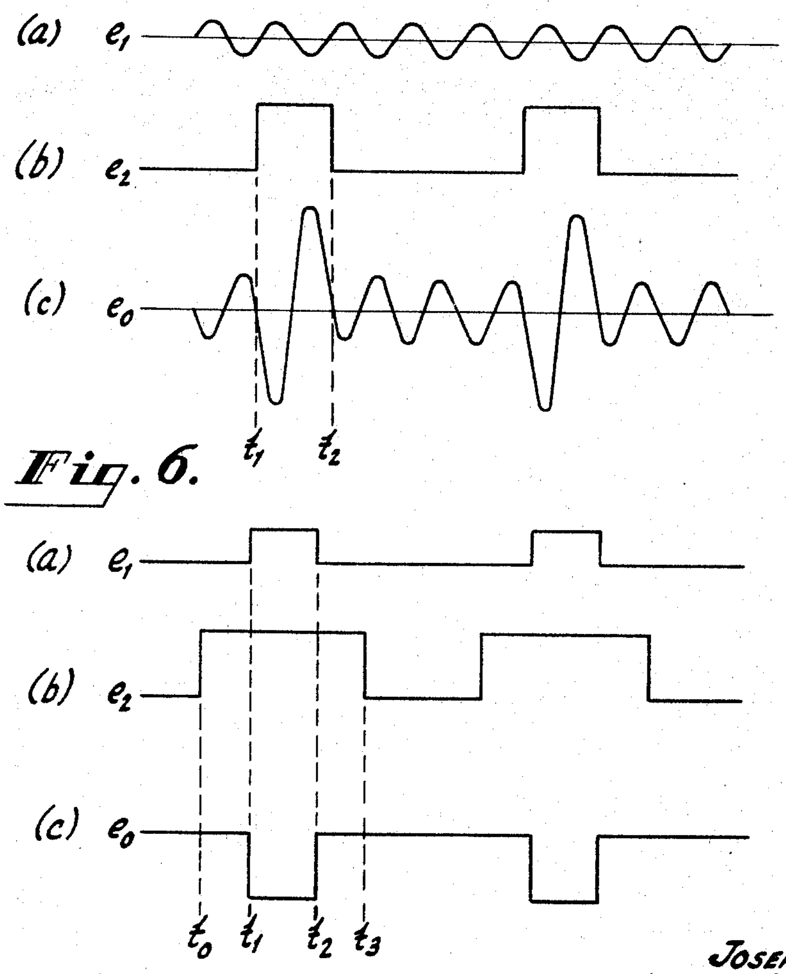

The case where the signal $e_1$ is analog or continuous and where the signal $e_2$ is intermittent during the time period under consideration is illustrated in FIG. 5. Again, for convenience of illustration, the signal $e_1$ is illustrated as a single frequency sinusoid in waveform (*a*). The signal $e_2$ is illustrated in waveform (*b*) as a pulse which occurs only during a discrete interval or intervals during the time period under consideration. The polarity of this pulse as illustrated is for use with a P-type transistor 3 as illustrated in FIG. 1. For use with an N-type transistor 3 as in FIG. 9, the pulse polarity should be reversed.

Prior to the occurrence at time $t_1$ of the leading edge of the pulse signal $e_2$, the amplifier is operative with a constant gain to amplify the input signal $e_1$. When the pulse signal $e_2$ is applied to the gate $3g$ of the feedback transistor from time $t_1$ to time $t_2$, the impedance of the feedback channel increases so that less output signal is fed back to the input. The gain of the amplifier increases with the result that from time $t_1$ to time $t_2$ the output signal $e_0$ is much larger than either before time $t_1$ or after time $t_2$.

A typical application is a gate or strobe amplifier where the output signal $e_0$ is being applied to a threshold device. In such an application the threshold device would be responsive only to the increased amplitude of the output signal $e_0$ during the presence of the gating pulse $e_2$.

*Case IV*

The case where both signals $e_1$ and $e_2$ occur only at discrete intervals during the time period under consideration is illustrated in FIG. 6. This case is similar to the Case III in that the signal $e_2$ increases the gain of the amplifier during a gating or strobing interval. Again the illustrated polarity of the $e_2$ pulse is for a P-type transistor 3. For an N-type transistor 3, the pulse polarity should be reversed. Although the signal $e_1$ is illustrated in waveform (*a*) as a square pulse, it may be of any shape so long as it occurs only during the discrete interval defined by times $t_1$ and $t_2$. The signal $e_2$ increases the gain of the amplifier for the interval $t_0$ to $t_3$ so that the output signal $e_0$ occurring during this interval is a product of the increased gain.

A typical application is as a sense amplifier for a computer memory wherein the signal $e_1$ is the signal being sensed and the signal $e_2$ is a clock signal. It should be apparent to those skilled in the art that the clock signal $e_2$ need not overlap the sense signal $e_1$ but may be present only during a portion of the time duration of the sense signal.

Figure 7:
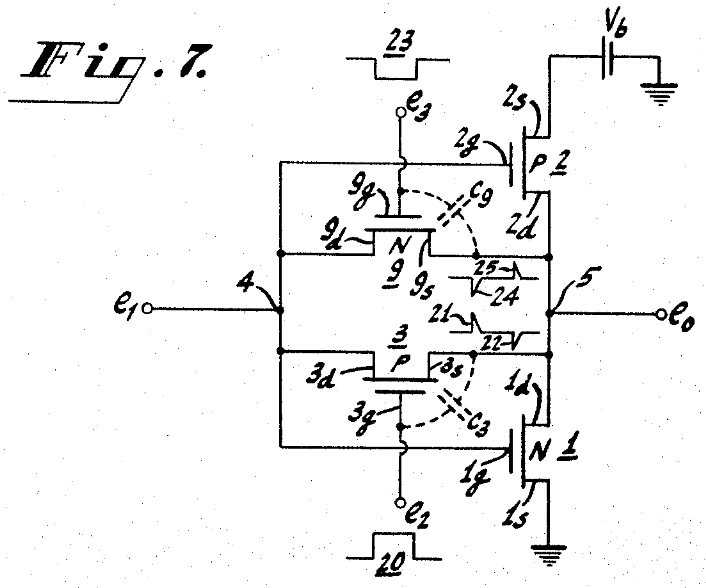
FIG. 7 is a circuit diagram of another embodiment of the invention.

The circuit in FIG. 7 illustrates the connection of a pair of opposite conductivity type feedback transistors between the input and output connections 4 and 5, respectively. Circuit components in FIG. 7 which are the same as corresponding components in FIG. 1 are designated by the same reference characters. The additional feedback transistor 9 is an N-type having its conduction channel connected in parallel with the conduction channel of the feedback transistor 3. To this end, the drain 9*d* and the source 9*s* are connected to the input and output connections 4 and 5, respectively. Each feedback transistor 3 and 9 is illustrated by dashed connections to have gate-to-source capacitances $C_3$ and $C_9$, respectively. An electrical signal $e_3$ is applied to the gate 9*g* of the additional feedback transistor.

Consider that the static or D.C. components of the signals $e_2$ and $e_3$ are such that each transistor is conductive. For example, assume that $e_{dc3}$ is zero volt and that $e_{dc9}$ is $+V_b$ volt. For the previously described Case IV of a gating or strobing amplifier, the signal $e_2$ is in the form of a positive pulse 20 at the sampling interval. Due to the gate-to-source capacitance $C_3$, there appear at the output connection spikes 21 and 22 coincident with the leading and trailing edges of the pulse 20 and having the illustrated polarities. These spikes 21 and 22 are obviously undesirable in that they distort the amplified signal $e_1$.

The additional N-type feedback transistor 9 operates to substantially cancel the spikes 21 and 22. To this end, the signal $e_3$ is illustrated as a negative pulse 23 of which the leading and trailing edges are coincident with the leading and trailing edges of the pulse 20. Due to the capacitance $C_9$ the spikes 24 and 25 occur coincident with the leading and trailing edges of the pulse 23 and with polarities which are opposite to the polarities of the spikes 21 and 22. Consequently, the spikes 24 and 25 tend to cancel the spikes 21 and 22 so that there is substantially no distortion of the amplified signal due to the capacitances $C_3$ and $C_9$.

It is also apparent that in an integrated circuit the sources 1*s* and 2*s*, the drains 3*d* and 9*d* could be defined by a region in the semiconductor material which is common to the conduction channel of each of the three transistors. It is further apparent that in integrated form the gates 1*g* and 2*g* could be a single gate electrode which is insulated from and common to the conduction channel of each of the transistors 1 and 2.

The amplifier embodiments of FIGS. 1 and 9 are inverting types which may be considered as single stage amplifiers. In these embodiments, the feedback transistor 3 functions to provide D.C. stabilization in the high gain regions of the transfer characteristics. If an odd plurality of insulated-gate transistor inverting amplifier stages are connected in cascade, a single feedback impedance or insulated-gate field-effect transistor connected between the output and input can provide not only D.C. stabilization but also can prevent the amplifier from oscillating and thus provide A.C. stabilization.

Figure 8:
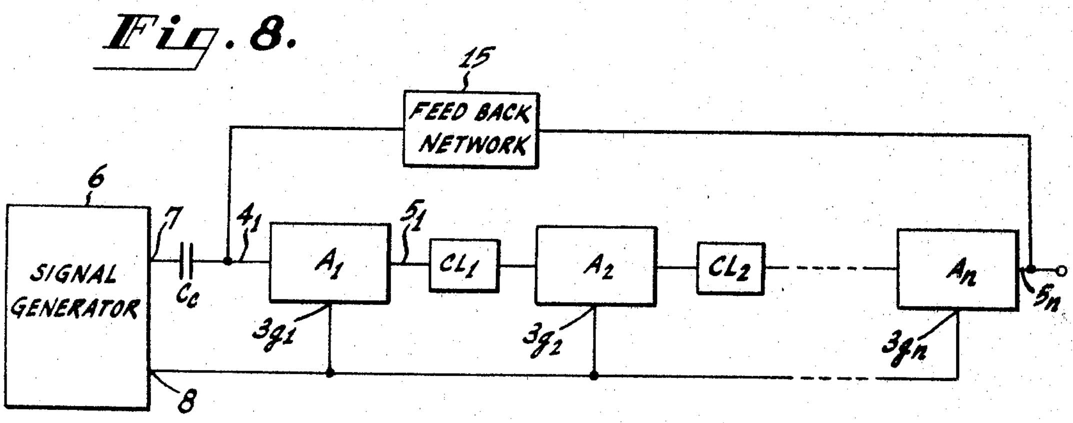
FIG. 8 is a block diagram of a plurality of amplifiers connected in cascade.

In FIG. 8, a plurality *n* of inverting type insulated-gate field-effect transistor amplifier stages $A_1, A_2 \ldots A_n$ are coupled in cascade by way of coupling links $CL_1$, $CL_2 \ldots CL_{n-1}$. The coupling links may include a strictly conductive connection from the output of one stage to the input of the next stage without disturbance of the static D.C. operating voltage so long as the output impedance of the signal generator 6 is infinite or a coupling capacitor $C_c$ is connected between signal generator terminal 7 and the input connection $\mathbf{4}_1$ of the first amplifier stage $A_1$. The amplifier stages $A_1, A_2 \ldots A_n$ may or may not have the feedback transistor 3 coupled between their input and output connections 4 and 5. For the case where the feedback transistor 3 is so connected in each amplifier stage, the gate electrodes $3_{g1}, 3_{g2} \ldots 3_{gn}$ are illustrated as connected to the terminal 8 of the signal generator 6. The output connection $\mathbf{5}_n$ of the last stage $A_n$ is connected by way of a feedback circuit 15 to the input connection $\mathbf{4}_1$ of the first amplifier stage $A_1$.

As mentioned previously, where *n* is an odd number, the cascaded amplifier can be stabilized by means of a single feedback impedance. Thus, the feedback circuit 15 may include an impedance, such as the conduction path of an insulated-gate field-effect transistor, connected between the output $5_n$ and the input $4_1$. Although each amplifier stage may include a feedback transistor 3 which is biased into conduction, the feedback transistors 3 are not necessary and may either be eliminated or biased into nonconduction by way of signal generator terminal 8. The feedback impedance 15 therefore serves to D.C. stabilize the entire amplifier even where the coupling links CL are direct connections and to A.C. stabilize the amplifier with appropriate negative feedback over the frequency range of interest.

The cascaded amplifier embodiment of FIG. 8 can function with constant or with variable gain. For constant gain operation the feedback impedance 15 is held constant. Variable gain is achieved by providing one or more of the stages $A_1$, $A_2$ . . . $A_n$ with feedback transistors 3 and applying control signals to the gate electrodes thereof. For example, the first stage $A_1$ may be provided with a feedback transistor 3 and the control signal $e_2$ (FIG. 1 or FIG. 9) may be applied thereto. The remainder of the amplifier stages $A_2$ . . . $A_n$, which need not have feedback transistors, function to amplify the output signal provided by the first stage.

When the FIG. 8 amplifier is operated with constant gain, the feedback circuit 15 may also include any conventional network to achieve the typical operational functions.

The amplifier embodiments of FIGS. 1, 7, 8 and 9 are especially attractive for use in integrated circuit structures since all components including feedback impedance 15 (FIG. 8) can be insulated-gate field-effect transistors. The preceding description of the dynamic operation of the amplifier is based on the assumption that the dynamic signal $e_1$ is a small signal so that the amplifier operates solely within its linear range or the region 10 in FIGS. 2 and 10. However, this is not necessary. The dynamic signal $e_1$ may be large enough so that either the transistor 1 or the transistor 2 (in the case of FIG. 1) becomes cut off due to application of this signal. This corresponds to operation in both region 10 and one of the regions 11 or 12 in FIGS. 2 and 10.

What is claimed is:

1. An amplifier having a transfer characteristic with two separate low gain regions and a high gain region disposed therebetween comprising first and second enhancement type field effect transistors of different conductivity types connected in circuit with an input and an output terminal of said amplifier, each of said transistors having a gate electrode and a source-drain conduction path, the gate electrodes of the transistors being connected to said input terminal, means for coupling the source-drain path of said transistors in series, said means further coupling said output terminal in common with the source drain paths of both said transistors, a feedback path coupled between said input and output terminals and having a D.C. feedback characteristic which intersects said amplifier transfer characteristic in said high gain region, and bias means adapted to apply operating voltage to said amplifier, said bias means including connections to the free ends of said source-drain conduction paths.

2. The invention according to claim 1 wherein said feedback path includes the source-drain conduction path of a third insulated-gated field-effect transistor.

3. The invention according to claim 2 wherein said third transistor has a gate electrode, and wherein input means is adapted to apply input signal energy to said input terminal and to said third transistor gate electrode.

4. The invention according to claim 3 wherein said input signal energy includes a first electrical signal applied to said input terminal and a second electrical signal applied to said third transistor gate electrode, and wherein both of said electrical signals are variable with time whereby said amplifier operates as a variable gain amplifier.

5. The invention according to claim 4 wherein said second and third transistors are of the enhancement type.

6. An electrical circuit comprising, first and second pairs of insulated-gate field-effect transistors, the transistors of each pair being of opposite conductivity types, each of said transistors including a conduction channel, means for coupling one end of the conduction channels of said first and second pairs of transistors in common to an output connection, a first gate means insulated from the conduction channels of said first pair of transistors and coupled to a first input connection, means for coupling the other ends of the conduction channels of said second pair of transistors to said first input connection, second and third gates insulated from the conduction channels of said second pair of transistors and coupled to second and third input connections, respectively, and individual electrical connections to the other ends of the conduction channels of said first pair of transistors.

7. The invention as claimed in claim 6 wherein said electrical connections are adapted to apply an operating voltage between the other ends of the conduction channels of said first pair of transistors, and wherein input means is adapted to apply electrical energy to said first, second and third input connections.

References Cited

UNITED STATES PATENTS

| | | | |
|---|---|---|---|
| 3,135,926 | 6/1964 | Bockemuehl | 330—38 |
| 3,140,408 | 7/1964 | May | 307—88.5 |
| 3,289,093 | 11/1966 | Wanlass | 307—88.5 X |

ROY LAKE, *Primary Examiner.*

J. B. MULLINS, *Assistant Examiner.*